(12) United States Patent
Cheng et al.

(10) Patent No.: US 9,558,950 B1
(45) Date of Patent: Jan. 31, 2017

(54) OVERHANG HARDMASK TO PREVENT PARASITIC EPITAXIAL NODULES AT GATE END DURING SOURCE DRAIN EPITAXY

(71) Applicant: International Business Machines Corporation, Armonk, NY (US)

(72) Inventors: Kangguo Cheng, Schenectady, NY (US); Pouya Hashemi, White Plains, NY (US); Shogo Mochizuki, Clifton Park, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/829,856

(22) Filed: Aug. 19, 2015

(51) Int. Cl.
| | |
|---|---|
| H01L 29/78 | (2006.01) |
| H01L 21/28 | (2006.01) |
| H01L 29/66 | (2006.01) |
| H01L 29/423 | (2006.01) |

(52) U.S. Cl.
CPC ... *H01L 21/28132* (2013.01); *H01L 29/42364* (2013.01); *H01L 29/42376* (2013.01); *H01L 29/66545* (2013.01)

(58) Field of Classification Search
CPC ...... H01L 29/78; H01L 29/785; H01L 29/513; H01L 29/517; H01L 29/518; H01L 29/665; H01L 29/66545; H01L 29/4966; H01L 29/6659; H01L 29/66; H01L 29/792; H01L 29/49; H01L 29/51; H01L 29/423; H01L 29/7813; H01L 29/4236; H01L 29/0696; H01L 29/407

USPC ........ 257/412, 288, 331, 366, 429, 387, 411
See application file for complete search history.

(56) References Cited

U.S. PATENT DOCUMENTS

| | | | |
|---|---|---|---|
| 4,198,250 A | 4/1980 | Jecmen | |
| 4,330,931 A * | 5/1982 | Liu | ............ H01L 21/033 148/DIG. 141 |
| 4,703,551 A * | 11/1987 | Szluk | ............ H01L 29/78 257/E21.64 |
| 5,464,782 A * | 11/1995 | Koh | ............ H01L 29/66606 257/E21.432 |
| 5,650,343 A * | 7/1997 | Luning | ............ H01L 21/266 257/E21.205 |
| 6,495,385 B1 | 12/2002 | Xie | |

(Continued)

OTHER PUBLICATIONS

Kangguo Cheng, et al.; "Overhang Hardmask to Prevent Parasitic Epitaxial Nodules at Gate End During Source Drain Epitaxy"; U.S. Appl. No. 14/964,909, filed Dec. 10, 2015.

(Continued)

*Primary Examiner* — Chuong A Luu
(74) *Attorney, Agent, or Firm* — Cantor Colburn LLP; Vazken Alexanian

(57) ABSTRACT

A method of making a semiconductor device includes forming a gate covered by a hard mask over a substrate; disposing a mask over the gate and the hard mask; patterning the mask to expose a portion of the gate and the hard mask; cutting the gate and hard mask to form two shorter gates, each of the two shorter gates having an exposed end portion; undercutting the exposed end portion of at least one of the two shorter gates to form an overhanging hard mask portion over the exposed end portion; and forming spacers along a gate sidewall and beneath the overhanging hard mask portion.

6 Claims, 10 Drawing Sheets

(56) References Cited

U.S. PATENT DOCUMENTS

| | | | |
|---|---|---|---|
| 6,633,056 B2 | 10/2003 | Xie | |
| 6,951,783 B2 | 10/2005 | Mathew et al. | |
| 2003/0049876 A1* | 3/2003 | Mori | H01L 21/28123 438/23 |
| 2009/0050963 A1* | 2/2009 | Peidous | H01L 21/28114 257/344 |
| 2010/0006955 A1* | 1/2010 | Takimoto | H01L 29/42368 257/410 |
| 2014/0353730 A1* | 12/2014 | Hook | H01L 29/785 257/288 |

OTHER PUBLICATIONS

List of IBM Patents or Patent Applications Treated as Related—Date Filed: Feb. 2, 2016; 1 page.

* cited by examiner

OVERHANG HARDMASK TO PREVENT PARASITIC EPITAXIAL NODULES AT GATE END DURING SOURCE DRAIN EPITAXY

BACKGROUND

The present invention generally relates to metal-oxide-semiconductor field-effect transistors (MOSFET), and more specifically, to gate spacers.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

Gate spacers form an insulating film along gate sidewalls. Gate spacers may also initially be formed around "dummy" gate sidewalls in replacement gate technology. The gate spacers are used to define source/drain regions in active areas of a semiconductor substrate located slightly away from the gate.

SUMMARY

According to one embodiment of the present invention, a method of making a semiconductor device includes forming a gate covered by a hard mask over a substrate; disposing a mask over the gate and the hard mask; patterning the mask to expose a portion of the gate and the hard mask; cutting the gate and hard mask to form two shorter gates, each of the two shorter gates having an exposed end portion; undercutting the exposed end portion of at least one of the two shorter gates to form an overhanging hard mask portion over the exposed end portion; and forming spacers along a gate sidewall and beneath the overhanging hard mask portion.

In another embodiment, a method of making a semiconductor device includes forming a gate covered by a hard mask over a substrate; disposing a mask over the gate; patterning the mask to expose a portion of the gate; cutting the gate to form two shorter gates, each of the two shorter gates having at least one exposed end portion, and remaining portions of the two shorter gates being covered by the mask; undercutting the exposed end portion of at least one of the two shorter gates to form an overhanging hard mask portion over the exposed end portion; and forming spacers along a gate sidewall and beneath the overhanging hard mask portion.

Yet, in another embodiment, a semiconductor device includes a gate disposed over a substrate; and a hard mask disposed over the gate, the hard mask having an overhanging portion confined to an end portion of the gate.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 3A-7 illustrate exemplary methods of making a semiconductor device according to embodiments of the present invention, in which:

FIG. 3A is a cross-sectional side view of a hard mask disposed over a dummy gate;

FIG. 5 is a cross-sectional side view after undercutting ends of the dummy gate;

FIG. 6 is a cross-sectional side view after depositing spacer material over the gate; and FIG. 7 is a cross-sectional side view after etching the spacer material to form spacers.

DETAILED DESCRIPTION

Figure 1:
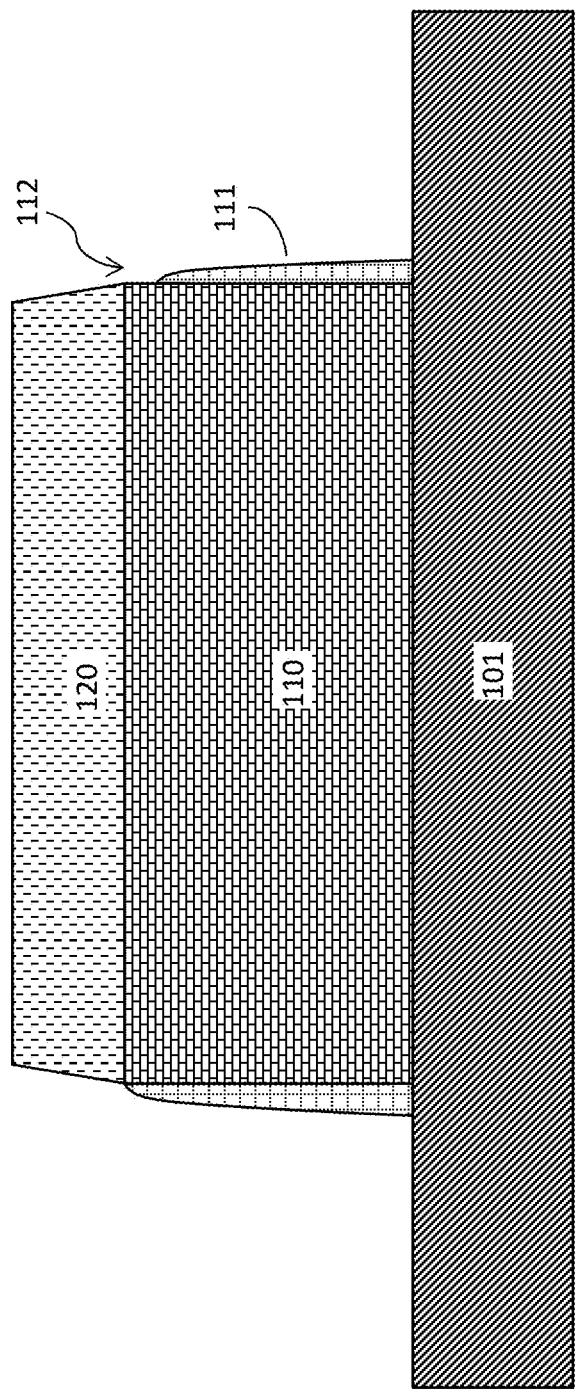
FIG. 1 illustrates a cross-sectional side view of a conventional "dummy" gate with thin spacers along the gate sidewalls.
Figure 2B:
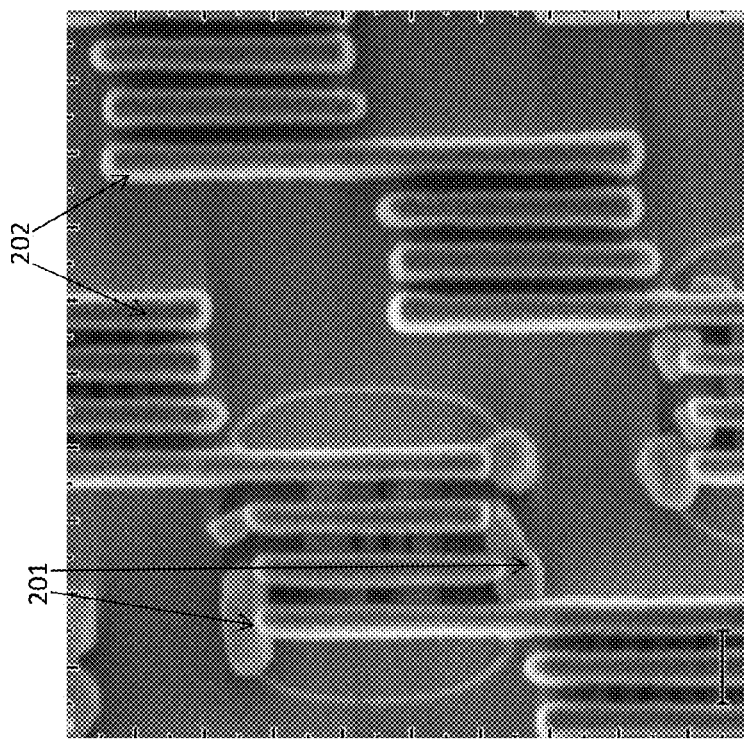
FIGS. 2A and 2B illustrate scanning electron micrograph (SEM) images showing epitaxial nodule formation on ends of gates.
Figure 2A:
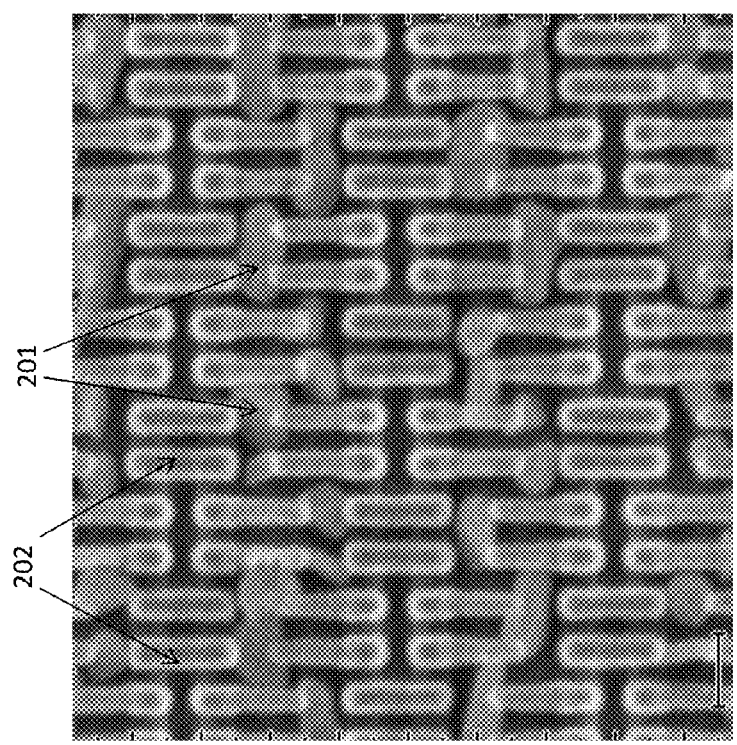

Conventionally, the spacer thickness along gate sidewalls is relatively thin to enable spacer pull down during FinFET fabrication. Thus, the ends of gate lines, where the gate is cut, may be weak spots. These weak spots are easily etched away accidentally. During spacer pull down around a dummy gate, the replacement material within the dummy gate, for example polysilicon, may be exposed when the spacers are etched. For example, as shown in FIG. 1, the topmost portion of spacer 111 on the right side of the gate is actually pulled down below the top surface of the dummy gate 110, thus leaving a portion of semiconductor material exposed during a later source/drain epitaxial merge operation. The exposed silicon may cause epitaxial nodule formation in the source/drain regions, as shown in FIGS. 2A and 2B, which may complicate further downstream processes and cause device shorting.

Accordingly, embodiments of the present invention provide methods of making semiconductor devices with hard mask overhangs confined to ends of dummy gates. The hard mask overhang enables the formation of thicker spacers at the gate cut location. Embodiments of the inventive structure and methods provide reduced risk of exposing the dummy gate material after spacer pull down etching, epitaxial nodule formation, and device shorting. It is noted that like reference numerals refer to like element s across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Referring once again to FIG. 1, there is shown a cross-sectional side view of a conventional "dummy" gate 110 formed over a substrate 101. A hard mask 120 is disposed over the dummy gate 110. The dummy gate 110 includes spacers 111 along the gate sidewalls. The region 112 at the end of the spacer 111, proximal to the hard mask 120, is relatively thin (e.g., 0.001 to 10 nanometers (nm)). The thin spacers 111, particularly in the region 112, are thus weak. Accordingly, the spacers 111 may get pulled down when they are etched (in region 112), exposing the replacement material within the dummy gate, which may be, for example, amorphous silicon (aSi) or polycrystalline silicon (polysilicon). The exposed aSi or polysilicon may lead to epitaxial nodule formation during the subsequent epitaxy processes, as shown in FIGS. 2A and 2B.

FIGS. 2A and 2B illustrate scanning electron micrograph (SEM) images showing epitaxial nodules 201 formed on ends of gates 202. The epitaxial nodules 201 result from growth on exposed polysilicon of the dummy gates 202 after spacer pull-down etching, which can lead to shorting.

Figure 3A:
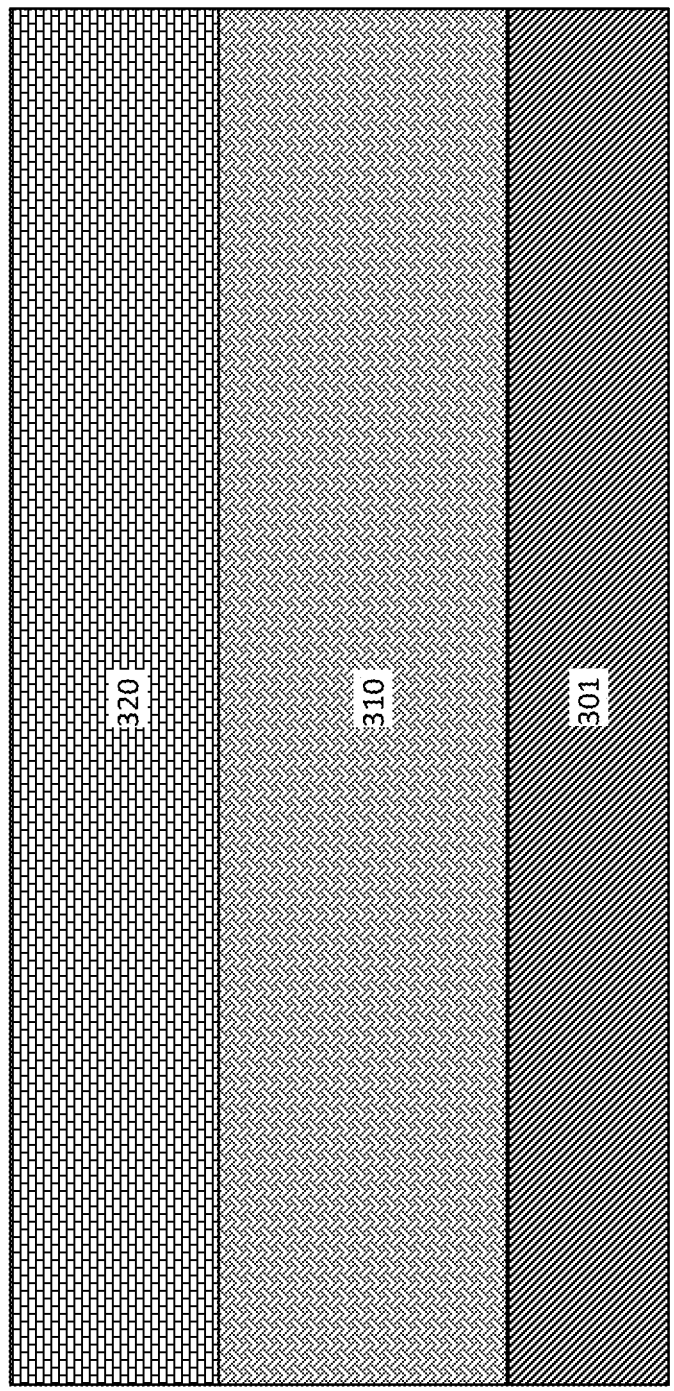

FIGS. 3A-7 illustrate exemplary methods of making a semiconductor device according to embodiments of the present invention. FIG. 3A is a cross-sectional side view of a hard mask 320 disposed over a dummy gate 310. FIG. 3B is a top view of FIG. 3A showing the hard masks 320 disposed over dummy gates 310 (not shown).

The replacement material forming the dummy gate 310 is disposed over a substrate 301. Non-limiting examples of suitable substrate materials include silicon, germanium, gallium arsenide (GaAs), an alloy of silicon and germanium, indium phosphide (InP), III-V or II-VI semiconductor materials, or any combination thereof. Other examples of suitable substrates include silicon-on-insulator (SOI) substrates with buried oxide (BOX) layers. The substrate 301 may further include patterns such as active semiconductor regions and isolation regions. The active semiconductor regions may include fins.

The thickness of the replacement material forming the dummy gate 310 may generally vary and is not intended to be limited. In one aspect, the thickness of the replacement material forming the dummy gate 310 is in a range from about 30 nm to about 300 nm. In another aspect, the thickness of the replacement material forming the dummy gate 310 is in a range from about 60 nm to about 150 nm.

In one embodiment, the dummy gate 310 includes a dummy gate dielectric material on top of the substrate 101 and a dummy gate aSi or polysilicon on top of the dummy gate dielectric material. The dummy gate dielectric may include, e.g., silicon oxide, silicon oxynitride, or silicon nitride with a thickness ranging from 1 nm to 6 nm.

To form the hard mask 320, a hard mask material is deposited over the replacement gate material. The hard mask 320 may be an insulating hard mask material. Non-limiting examples of suitable materials for the hard mask 320 include silicon oxide, silicon nitride ($Si_3N_4$), SiOCN, SiBCN, or any combination thereof. The thickness of the material forming the hard mask 320 may generally vary and is not intended to be limited. In one aspect, the thickness of the material forming the hard mask 320 is in a range from about 10 nm to about 100 nm. In another aspect, the thickness of the material forming the hard mask 320 is in a range from about 30 nm to about 60 nm.

Figure 3B:
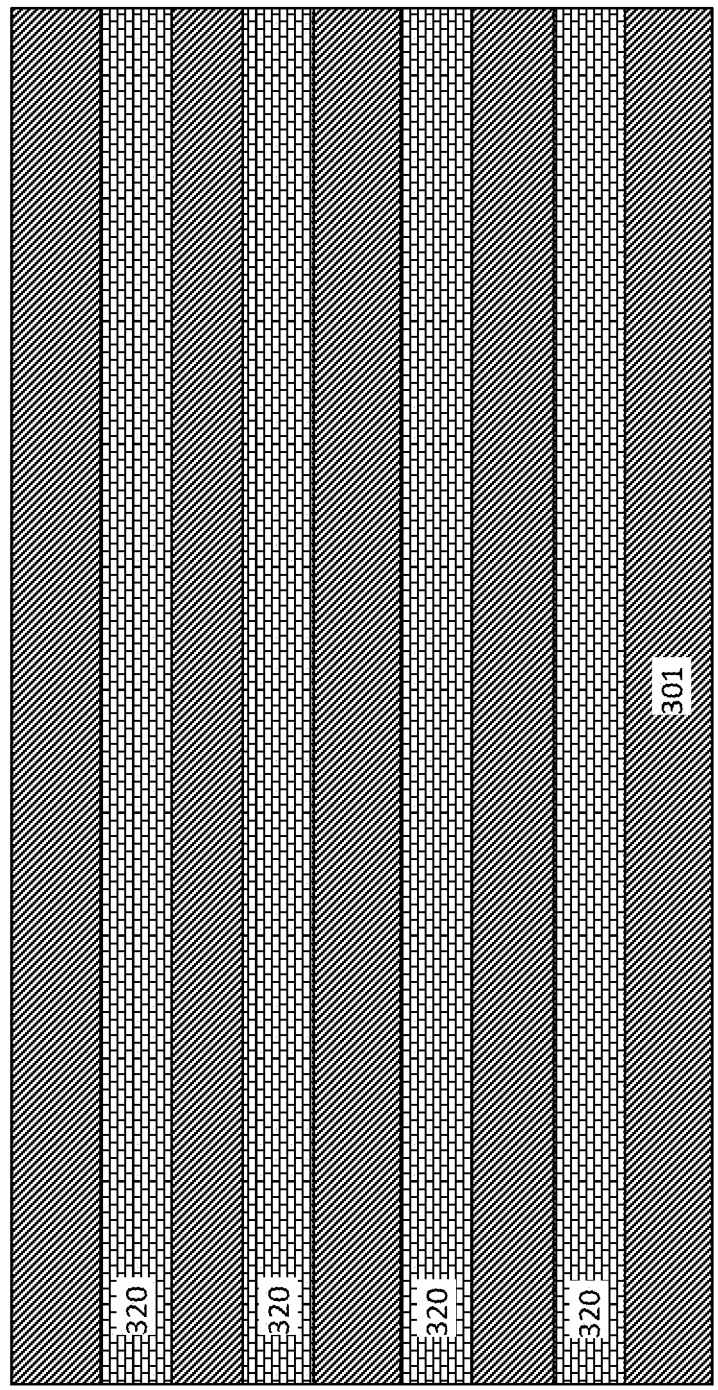
FIG. 3B is a top view of FIG. 3A showing hard masks disposed over dummy gates.

The hard mask material and the replacement gate material are patterned and etched to form the dummy gates 310 covered by hard masks 320 as shown in FIG. 3B. For example, a photoresist (not shown) is patterned by exposing to a desired pattern of radiation. Then the exposed photoresist is developed and with a resist developer to provide a patterned photoresist over the hard mask 320. The photoresist pattern is transferred through the hard mask material and replacement gate material by performing a suitable etching process. Then the photoresist is removed. Any other suitable patterning technique (e.g., sidewall imaging transfer) may also be used to pattern the dummy gates.

Figure 4A:
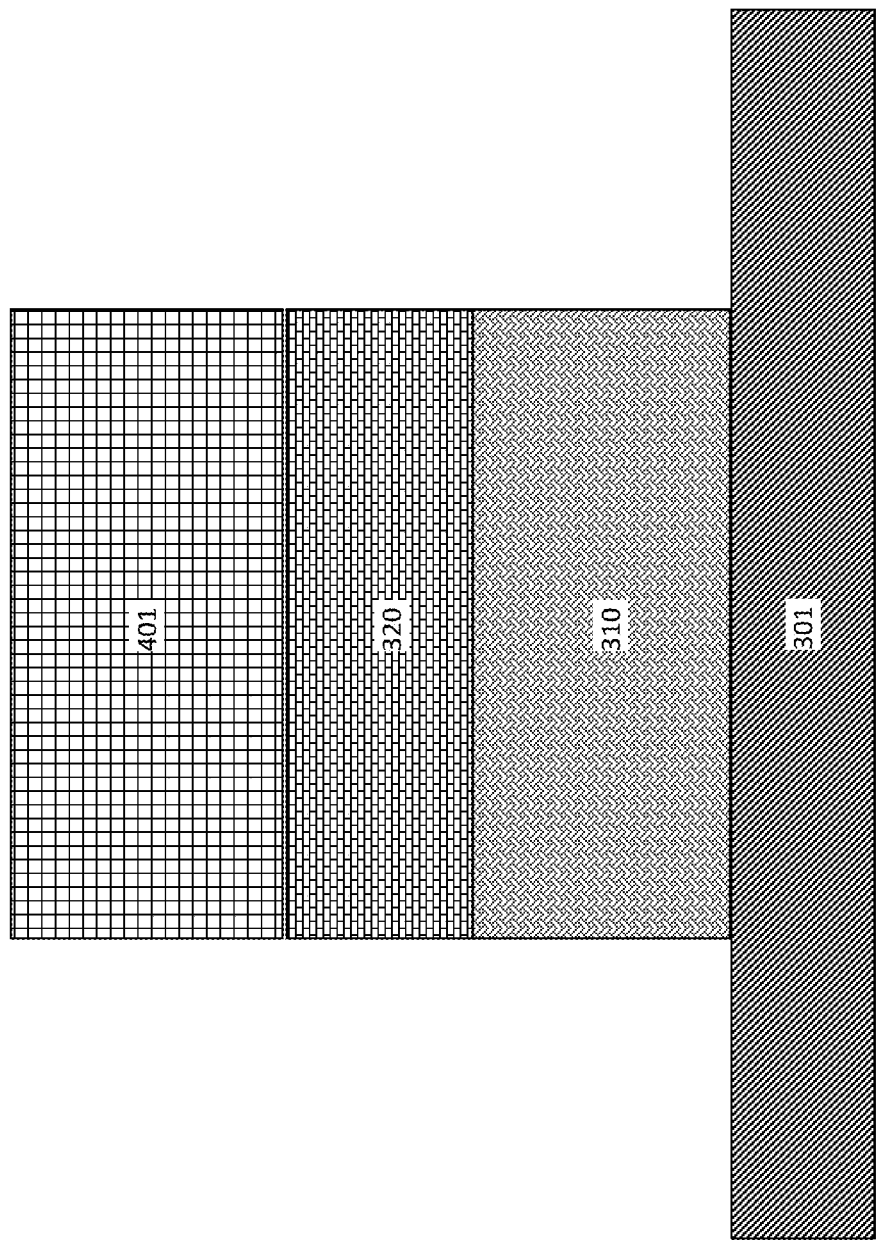
FIG. 4A is a cross-sectional side view after depositing a mask over the dummy gate and cutting the dummy gate.
Figure 4B:
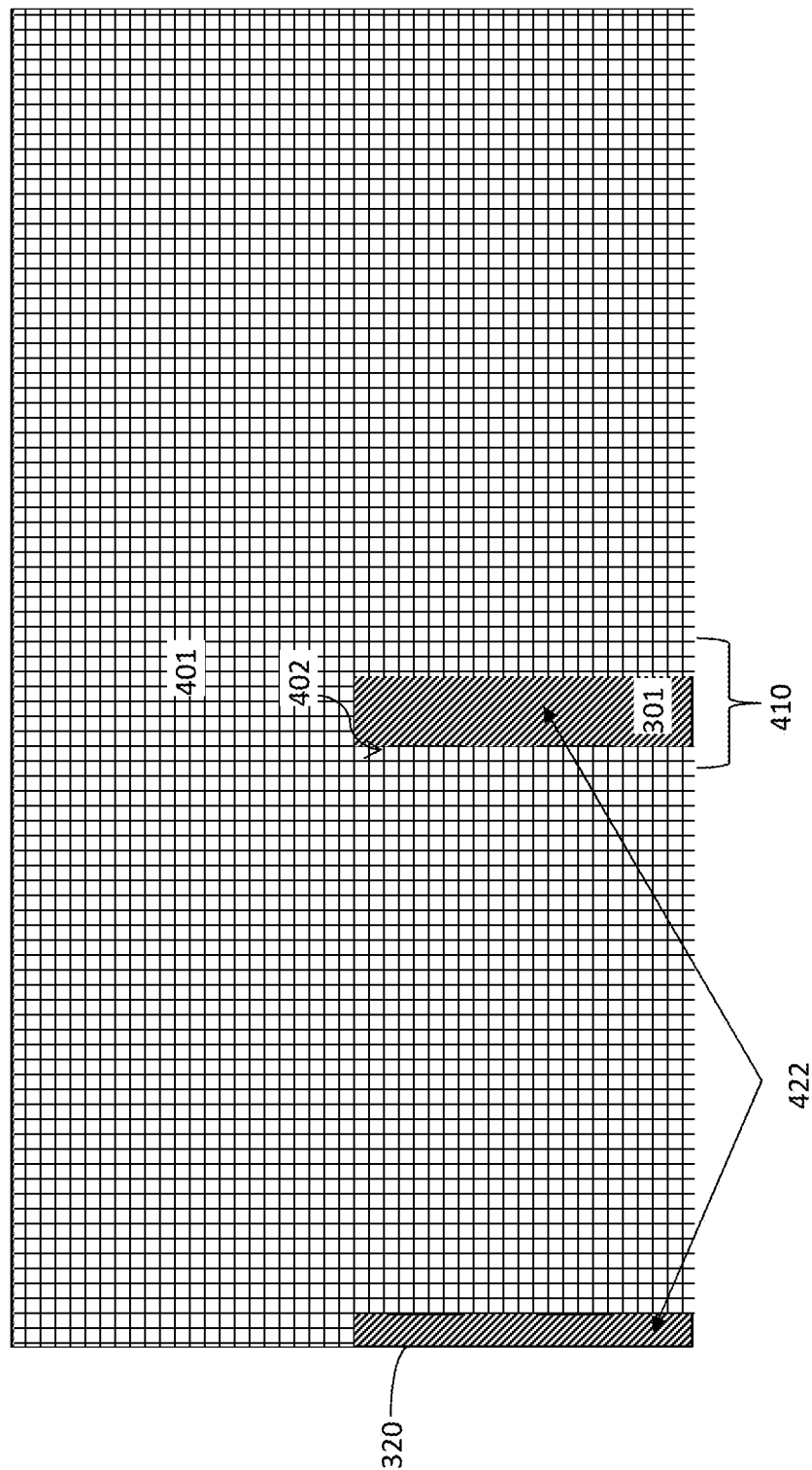
FIG. 4B is a top view of FIG. 4A showing the cut openings through the mask.
Figure 4C:
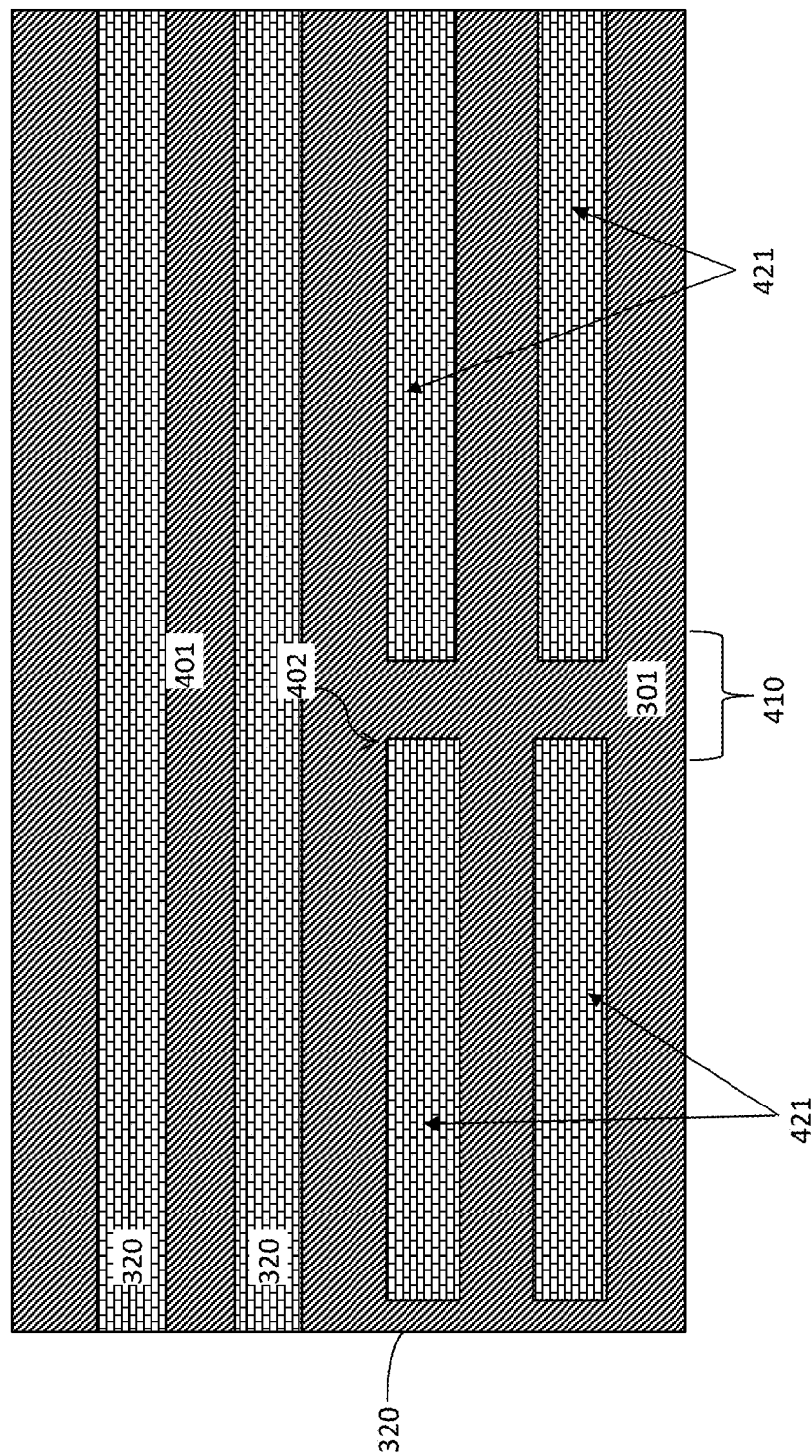
FIG. 4C is a top view of FIG. 4B without the mask.

FIG. 4A is a cross-sectional side view after depositing a mask 401 over the dummy gate 310 and hard mask 320 and cutting two of the dummy gates 310. FIG. 4B is a top view of FIG. 4A after forming cut openings 422 through the mask 401. The mask 401 and dummy gates 310 are cut to expose the substrate 301 beneath. FIG. 4C is a top view of FIG. 4B without the mask 401, showing the two shorter cut gates 421.

The mask 401 may be, for example, a photoresist material. In some embodiments, the photoresist may be used in conjunction with other material layers to facilitate the patterning process. The photoresist is patterned by exposing to a desired pattern of radiation and developing the exposed photoresist with a resist developer to provide a patterned photoresist over the hard mask 320. The mask 401 covers the dummy gates 310 covered by the hard mask 320, and only the ends 402 are exposed after the mask 401 is patterned. The dummy gates 310 are then cut in the exposed region 410.

To cut the dummy gate 310 and hard mask 320, at least one etching process is employed to sever the dummy gate 310 into two shorter gate portions. The etching process may be a dry etch (e.g., reactive ion etching, plasma etching, ion beam etching, or laser ablation). The etching process may be a wet chemical etch (e.g., potassium hydroxide (KOH)). Both dry etching (e.g., and wet chemical etching processes may be used.

Figure 5:
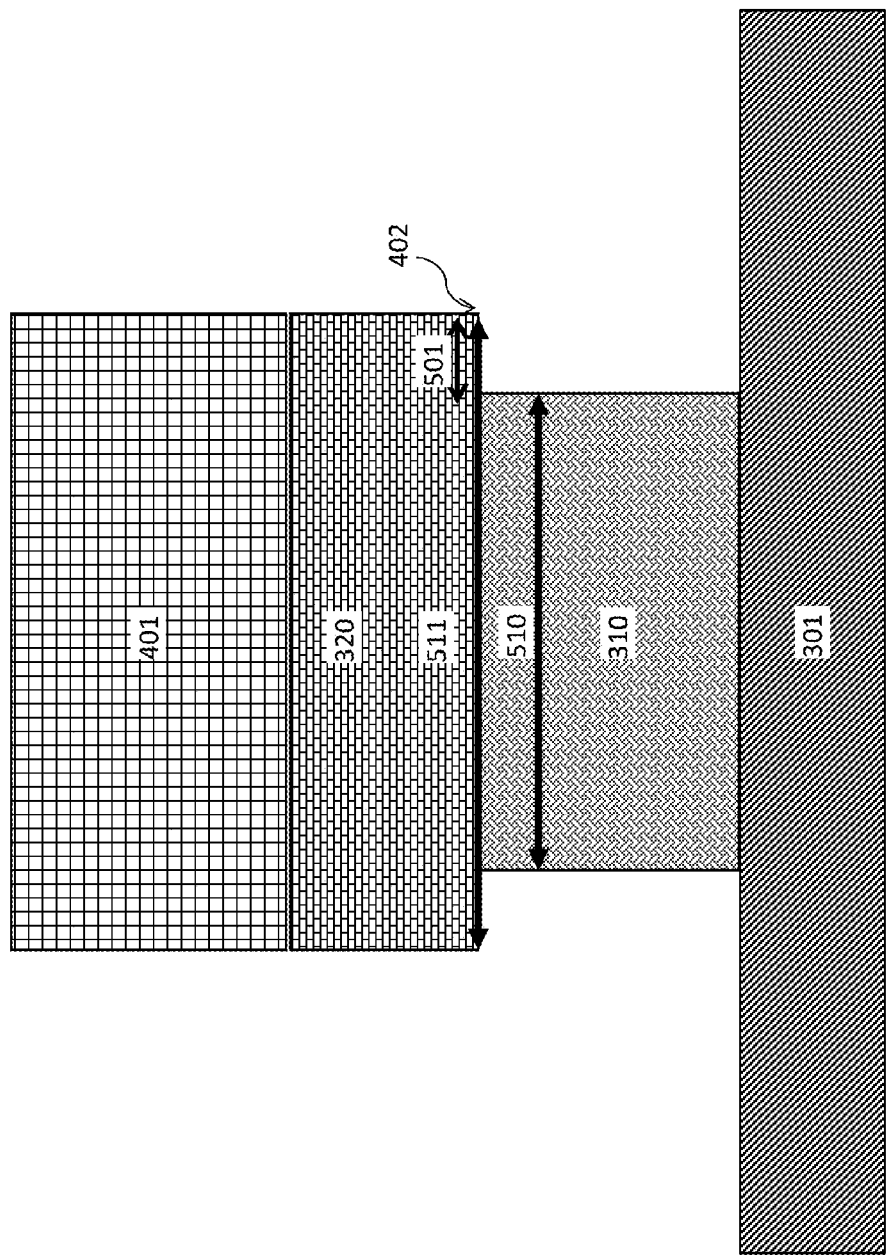

FIG. 5 is a cross-sectional side view after undercutting the dummy gate 310. Because the mask 401 covers the dummy gates 310, except for the exposed ends 402, only the ends 402 will be etched/undercut. The dummy gate 310 is etched only at one or more ends 402 of the dummy gate 310. The widths of the undercut end portions 402 are narrower than remaining portions underneath the mask 401. Because the mask 401 is still in place when the gate ends 402 are undercut, the dummy gate 320 width and hard mask 320 width (projecting into the page in the view shown in FIG. 5) remains intact in the regions beneath the mask 401. The hard mask length 511 is greater than the gate length 510. The widths of the patterned dummy gate 310 and hard mask 320 are substantially the same after undercutting.

Any suitable etching process may be employed to achieve the undercutting of the dummy gate 310. Plasma etching with chlorine is an exemplary etching process for etching silicon. Other non-limiting examples of etching processes include ion beam etching, plasma etching, wet etching, laser ablation, or any combination thereof.

The dummy gate 310 is undercut to form a hard mask overhang 501. In some embodiments, the overhang 501 is in a range from about 3 to about 30 nm wide. In other embodiments, the overhang 501 is in a range from about 6 to about 12 nm wide.

Figure 6:
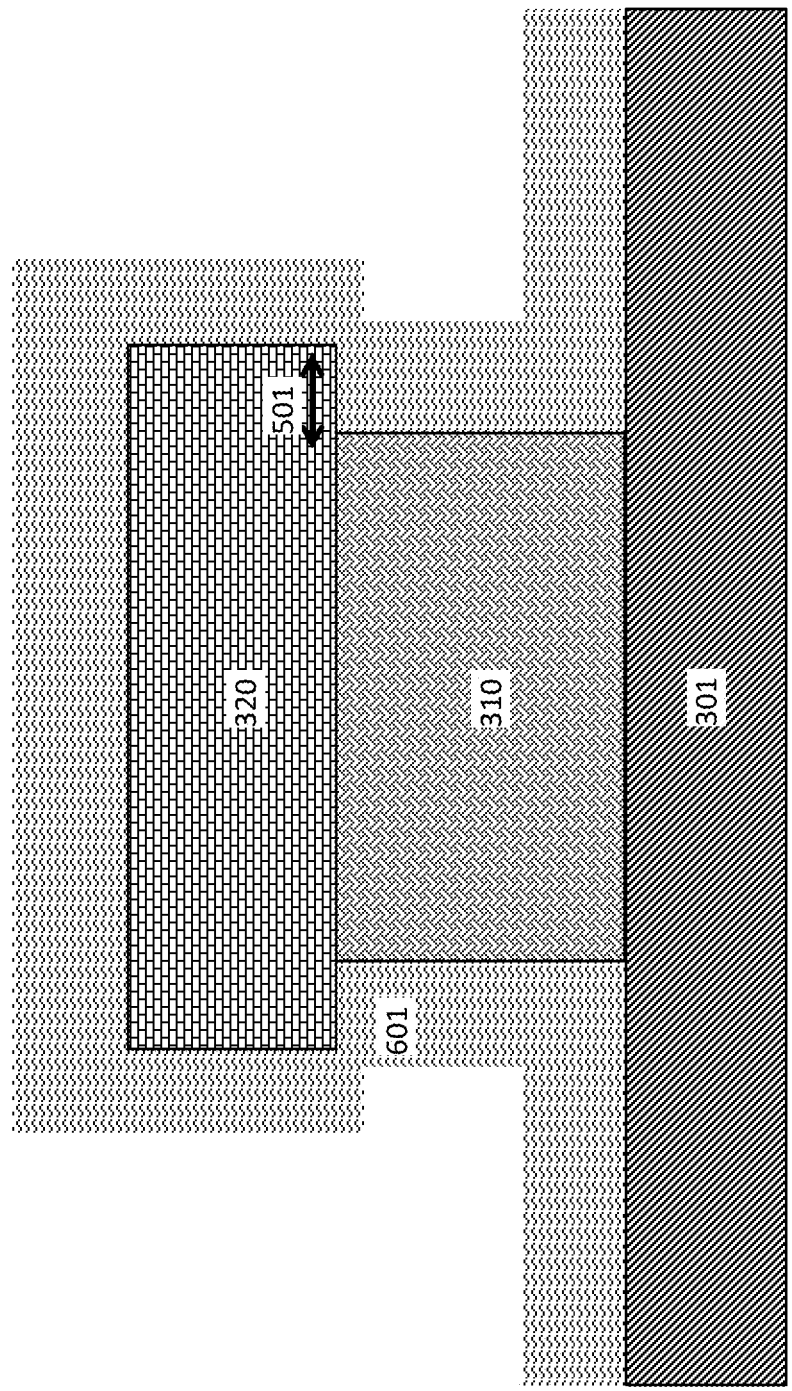

FIG. 6 is a cross-sectional side view after removing the mask 401 and depositing spacer material 601 over the dummy gate 310. The mask 401 is removed by a stripping process, for example, ashing when the mask 401 is a photoresist. The spacer material 601 covers the hard mask 320 and fills the gaps between the hard mask 320 overhang 501 and the substrate 301. The spacer material 601 is any suitable low-k spacer material. For example, the spacer material 601 may include Si, N, and at least one element selected from the group consisting of C and B. Additionally, the spacer material 401 may include Si, N, B, and C. Non-limiting examples of suitable low-k spacer material include $SiO_2$, SiN, SiBN, SiCN, SiBCN, or any combination thereof. The spacer material 601 is deposited by a deposition process, for example, chemical vapor deposition (CVD) or physical vapor deposition (PVD). The spacer material 601 is deposited as a blanket on all exposed surfaces.

Figure 7:
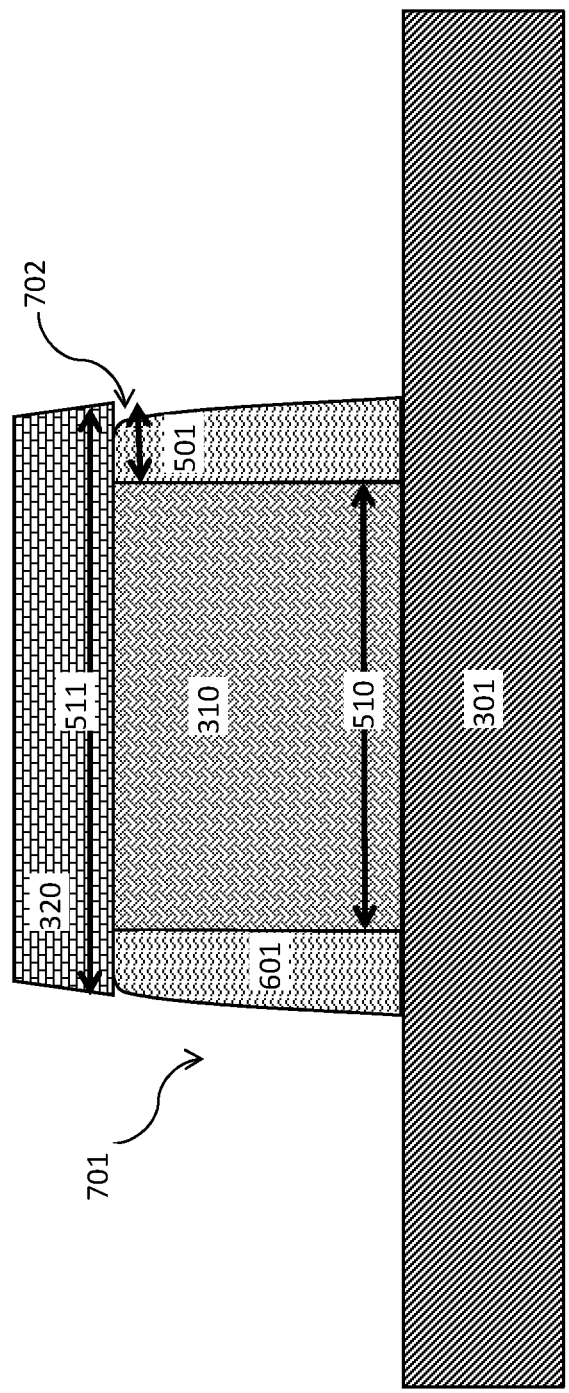

FIG. 7 is a cross-sectional side view after etching the spacer material 601 to form the spacers 701. Spacer etching is performed to form insulating film spacers on dummy gate 310 sidewalls. The spacers 701 are used for forming source/drain regions at regions slightly away from the gate 310. When the spacers 701 are etched by an anisotropic process, for example, RIE. The overhang 501 protects the spacer material under the hard mask 711, which prevents spacer pull down during etching.

The resulting thickness of the spacers 701 in the end region 702 is in a range from about 3 to about 30 nm. In some embodiments, the thickness of the spacers 701 in the end region 702 is in a range from about 8 to about 15 nm. The hard mask 320 overhang 501 allows for the spacer 701 to be thicker in the region 702 adjacent to the hard mask 320 overhang 501 (a surface of the dummy gate 310).

The hard mask 320 is longer than the dummy gate 310. In some embodiments, the length 510 of the dummy gate 310 is in a range from about 40 nm to about 2,000 nm, and the length 511 of the hard mask 320 (at the widest portion) is in a range from about 80 nm to about 4,000 nm. In other embodiments, the length 510 of the dummy gate 310 is in a range from about 120 nm to about 500 nm, and the length 511 of the hard mask 320 (at the widest portion) is in a range from about 240 to about 1,000 nm. Yet, in other embodiments, the length 511 of the hard mask 320 is greater than the length 510 of the dummy gate 310 by at least twice the width of the overhang 501.

The structure shown in FIG. 7 may be further processed to form any semiconductor device. Due to the thick spacers 701 formed around the dummy gates 320, the replacement material will not be exposed during etching, which eliminates the risk of epitaxial nodule formation after epitaxial growth.

As described above, embodiments of the present invention provide methods of making semiconductor devices with hard mask overhangs over the dummy gate. The hard mask overhang enables the formation of thicker spacers at the gate cut location, which is confined to the gate ends. Embodiments of the inventive structure and methods provide reduced risk of exposing the dummy gate material, epitaxial nodule formation, and device shorting.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor device, comprising:
a gate disposed over a substrate, the gate having a longitudinal axis defining a length of the gate, a transverse axis defining a width of the gate, and a first distal end and a second distal end arranged at opposing ends of the gate on the longitudinal axis of the gate, the length of the gate being greater than the width of the gate; and
a hard mask disposed over the gate, the hard mask having a longitudinal axis defining a length of the hard mask, a transverse axis defining a width of the hard mask, and a first distal end and a second distal end arranged at opposing ends of the hard mask on the longitudinal axis of the hard mask, the length of the hard mask being greater than the width of the hard mask, and the hard mask comprising an insulating material;

wherein the width of the gate and the hard mask are substantially the same, the length of the hard mask is greater than the length of the gate, and the hard mask has a first overhang region arranged over the first distal end of the gate and a second overhang region arranged over the second distal end of the gate; and wherein the gate comprises a polysilicon material or an amorphous silicon material that extends continuously from the substrate to the hard mask.

2. The semiconductor device of claim 1, wherein the first overhang region or the second overhang region has a width in a range from about 3 to about 30 nm.

3. The semiconductor device of claim 1, further comprising gate spacers disposed beneath the first overhang region and the second overhang region.

4. The semiconductor device of claim 3, wherein the gate spacer has a thickness in a range from about 3 to about 30 nm.

5. The semiconductor device of claim 3, wherein the gate spacer is SiO2, SiN, SiBN, SiCN, SiBCN, or any combination thereof.

6. The semiconductor device of claim 1, wherein gate comprises a replacement gate material.

* * * * *